(12) United States Patent
Shi

(10) Patent No.: US 10,700,138 B2
(45) Date of Patent: Jun. 30, 2020

(54) ACTIVE ILLUMINATING DISPLAY PANELS AND MANUFACTURING METHODS THEREOF COMPRISING PLURAL ILLUMINATING PATTERNS PROVIDING PLURAL COLOR LIGHTS

(71) Applicant: Shenzhen China Star Optoelectronics Semiconductor Display Technology Co., Ltd., Shenzhen, Guangdong (CN)

(72) Inventor: Wen Shi, Guangdong (CN)

(73) Assignee: Shenzhen China Star Optoelectronics Semiconductor Display Technology Co., Ltd., Shenzhen, Guangdong (CN)

(*) Notice: Subject to any disclaimer, the term of this patent is extended or adjusted under 35 U.S.C. 154(b) by 450 days.

(21) Appl. No.: 15/739,711

(22) PCT Filed: Sep. 20, 2017

(86) PCT No.: PCT/CN2017/102355
§ 371 (c)(1),
(2) Date: Dec. 23, 2017

(87) PCT Pub. No.: WO2019/010817
PCT Pub. Date: Jan. 17, 2019

(65) Prior Publication Data
US 2019/0019844 A1 Jan. 17, 2019

(30) Foreign Application Priority Data
Jul. 13, 2017 (CN) .......................... 2017 1 0570252

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3246* (2013.01); *H01L 27/3244* (2013.01); *H01L 51/5284* (2013.01); *H01L 51/56* (2013.01); *H01L 2227/323* (2013.01); *H01L 2251/5361* (2013.01)

(58) Field of Classification Search
CPC ... H01L 27/32; H01L 27/322; H01L 27/3246; H01L 27/3244; G02F 1/133617
USPC .................................. 250/226, 208.1, 214 R
See application file for complete search history.

(56) References Cited

U.S. PATENT DOCUMENTS

| | | | |
|---|---|---|---|
| 7,701,134 B2 * | 4/2010 | Yamazaki | H01L 27/1255 257/359 |
| 9,123,665 B2 | 9/2015 | Sago | |

(Continued)

FOREIGN PATENT DOCUMENTS

| | | |
|---|---|---|
| CN | 106784209 A | 5/2017 |
| CN | 106876433 A | 6/2017 |

*Primary Examiner* — Que Tan Le
(74) *Attorney, Agent, or Firm* — Andrew C. Cheng

(57) ABSTRACT

The present disclosure relates to an active illuminating display panel and a manufacturing method thereof. The light-emitting layer is configured to emit the red light or the green light instead of the blue light. The energy of the red light photons and the green light photons is lower than the energy of the blue light photons. As such, the high molecular organic material in the light-emitting layer may not decay easily and the lifecycle of the active illuminating display panel may be extended.

20 Claims, 3 Drawing Sheets

(56) References Cited

U.S. PATENT DOCUMENTS 9,923,034 B2 3/2018 Jiang et al.
2017/0040385 A1 2/2017 Li \* cited by examiner

ACTIVE ILLUMINATING DISPLAY PANELS AND MANUFACTURING METHODS THEREOF COMPRISING PLURAL ILLUMINATING PATTERNS PROVIDING PLURAL COLOR LIGHTS

BACKGROUND

1. Technical Field

The present disclosure relates to display field, more particularly to an active illuminating display panel and a manufacturing method thereof.

2. Description of Related Art

The active illuminating display panels include the display panels having organic light-emitting diodes (OLED) or quantum dot emitting diodes (QLED). The active illuminating displays have become the main product in the display field due to the attributes, such as fast response speed and high contrast. Currently, the active illuminating display may achieve full color display by the OLED or the QLED & color filter (CF). Specifically, the light-emitting layer of the OLED and the QLED may emit blue light, wherein the blue light is emitted directly from the blue sub-pixel area. The blue light is emitted to the illuminating CF within the red sub-pixel area and the green sub-pixel area. The red sub-pixel area may emit red light when being excited by the blue light, and the green sub-pixel area may emit green light when being excited by the blue light. Such that, the RGB (red-greed-blue) full color display may be achieved. However, the blue light photons have higher energy, which may result in the decay of the high molecular organic material in the light-emitting layer and reduce the lifecycle of the active illuminating display panel.

SUMMARY

The present disclosure relates to an active illuminating display panel, including: a substrate; a driving array layer covering the substrate, wherein the driving array layer includes a first area, a second area, and a third area configured along a direction parallel to the substrate in sequence, and the first area, the second area, and the third area are adjacent along the direction; a first illuminating pattern configured on the first area of the driving array layer, wherein the first illuminating pattern is made of a plurality of photoluminescence quantum dots; a second illuminating pattern configured on the third area of the driving array layer, wherein the second illuminating pattern is made of conversion illuminating material of a nanoparticle form, and each of the nanoparticles includes inorganic material and rare-earth ions doped in the inorganic material; a flat layer covering the first illuminating pattern, the second illuminating pattern, and the driving array layer, wherein the flat layer includes at least one connect hole, and a drain of a thin film transistor (TFT) of the driving array layer is exposed by the connect hole; a pixel electrode configured on the flat layer within the first area, the second area, and the third area, wherein the pixel electrode covers the connect hole and connects with the drain of the TFT; a pixel definition layer configured on intersections between the first area and the second area, and between the second area and the third area, wherein the pixel definition layer is made of opaque material and covers edges of the pixel electrode between the first area and second area, and between the second area and the third area; a third illuminating pattern configured on the pixel electrode; a reflection electrode covering the third illuminating pattern and the pixel definition layer; wherein the third illuminating pattern is configured to emit green light, the first illuminating pattern is configured to emit red light when being excited by the green light, and the second illuminating pattern is configured to emit blue light when being excited by the green light.

In another aspect, the present disclosure relates to an active illuminating display panel, including: a substrate; a driving array layer covering the substrate, wherein the driving array layer includes a first area, a second area, and a third area configured along a direction parallel to the substrate in sequence, and the first area, the second area, and the third area are adjacent along the direction; a first illuminating pattern configured on the first area of the driving array layer; a second illuminating pattern configured on the third area of the driving array layer; a flat layer covering the first illuminating pattern, the second illuminating pattern, and the driving array layer, wherein the flat layer includes at least one connect hole, and a drain of a thin film transistor (TFT) of the driving array layer is exposed by the connect hole; a pixel electrode configured on the flat layer within the first area, the second area, and the third area, wherein the pixel electrode covers the connect hole and connects with the drain of the TFT; a pixel definition layer configured on intersections between the first area and the second area, and between the second area and the third area, wherein the pixel definition layer covers edges of the pixel electrode between the first area and second area, and between the second area and the third area; a third illuminating pattern configured on the pixel electrode; a reflection electrode covering the third illuminating pattern and the pixel definition layer; wherein the third illuminating pattern is configured to emit green light when the first illuminating pattern is configured on the first area of the driving array layer, the first illuminating pattern is configured to emit red light when being excited by the green light, and the second illuminating pattern is configured to emit blue light when being excited by the green light; and the third illuminating pattern is configured to emit the red light when the first illuminating pattern is configured on the second area of the driving array layer, the first illuminating pattern is configured to emit the green light when being excited by the red light, and the second illuminating pattern is configured to emit the blue light when being excited by the red light.

In another aspect, the present disclosure relates to a manufacturing method of active illuminating display panels, including: providing a substrate; forming a driving array layer covering the substrate, wherein the driving array layer includes a first area, a second area, and a third area configured along a direction parallel to the substrate in sequence, and the first area, the second area, and the third area are adjacent along the direction; forming a first illuminating pattern on the first area or the second area of the driving array layer; forming a second illuminating pattern on the third area of the driving array layer; forming a flat layer covering the first illuminating pattern, the second illuminating pattern, and the driving array layer, wherein the flat layer includes at least one connect hole, and a drain of a thin film transistor (TFT) of the driving array layer is exposed by the connect hole; forming a pixel electrode on the flat layer within the first area, the second area, and the third area, wherein the pixel electrode covers the connect hole and connects with the drain of the TFT; forming a pixel definition layer configured on intersections between the first area and the second area, and between the second area and the third area, wherein the pixel definition layer covers edges of the pixel electrode between the first area and second area, and between the second area and the third area;

forming a third illuminating pattern configured on the pixel electrode, wherein the third illuminating pattern is configured to emit green light when the first illuminating pattern is configured on the first area of the driving array layer, the first illuminating pattern is configured to emit red light when being excited by the green light, and the second illuminating pattern is configured to emit blue light when being excited by the green light; and the third illuminating pattern is configured to emit the red light when the first illuminating pattern is configured on the second area of the driving array layer, the first illuminating pattern is configured to emit the green light when being excited by the red light, and the second illuminating pattern is configured to emit the blue light when being excited by the red light; forming a reflection electrode covering the third illuminating pattern and the pixel definition layer.

In view of the above, the present disclosure relates to the third illuminating pattern, that is, the light-emitting layer is configured to emit the red light or the green light instead of the blue light. The energy of the red light photons and the green light photons is lower than the energy of the blue light photons. As such, the high molecular organic material in the light-emitting layer may not decay easily and the lifecycle of the active illuminating display panel may be extended.

DETAILED DESCRIPTION

To clarify the purpose, technical solutions, and the advantages of the disclosure, embodiments of the invention will now be described more fully hereinafter with reference to the accompanying drawings, in which embodiments of the invention are shown. The figure and the embodiment described according to figure are only for illustration, and the present disclosure is not limited to these embodiments.

Figure 1:
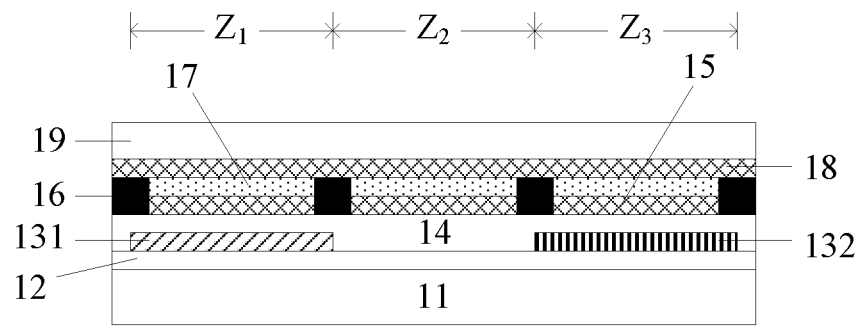
FIG. 1 is a schematic view of an active illuminating display panel in accordance with the first embodiment of the present disclosure.

Referring to FIG. 1, the present disclosure relates to an active illuminating display panel. The active illuminating display panel 10 may include a substrate 11, a driving array layer 12, a first illuminating pattern 131, a second illuminating pattern 132, a flat layer 14, a pixel electrode 15, a pixel definition layer (PDL) 16, a third illuminating pattern 17, and a reflection electrode 18.

In one example, the substrate 11 may include, but not limited to, glass substrate and plastic substrate, and the substrate 11 may be made of PET, PEN, or PI.

The driving array layer 12 covering the substrate 11 and the driving array layer 12 may include a first area Z1, a second area Z2, and a third area Z3 configured along a direction parallel to the substrate 11 in sequence, and the first area Z1, the second area Z2, and the third area Z3 are adjacent along the direction. The first area Z1, the second area Z2, and the third area Z3 may be respectively configured to be a red sub-pixel area, a green sub-pixel area, and a blue sub-pixel area of the active illuminating display panel 10. In each of the first area Z1, the second area Z2, and the third area Z3, an electrical component for controlling the corresponding sub-pixel, such as a thin film transistor (TFT), is configured in the driving array layer 12. The TFT may be a top-gate type TFT or a bottom-gate type TFT.

The first illuminating pattern 131 is configured on the first area Z1 of the driving array layer 12, and the first illuminating pattern 131 may be made of a plurality of red light photoluminescence quantum dots. The red light photoluminescence quantum dots may be excited by the green light and emit the red light, wherein a wavelength of the red light is greater than the wavelength of the green light.

The second illuminating pattern 132 is configured on the third area Z3 of the driving array layer 12, and the second illuminating pattern 132 is made of conversion illuminating material. The conversion illuminating material may be excited by the green and emit the blue light, wherein a wavelength of the blue light is less than the wavelength of the green light. The conversion illuminating material may be of a nanoparticle form, and each of the nanoparticles may include inorganic material and rare-earth ions doped in the inorganic material. The inorganic material may include, but not limited to, at least one of halides, oxides, sulfides, and sulfur oxides, and the rare-earth ions may include, but not limited to, at least one of $Er^{3+}$, $Ho^{3+}$, $Tm^{3+}$, $Pr^{3+}$, $Nd^{3+}$, and $Yb^{3+}$.

The flat layer 14 is configured to be a translucent structure in a whole surface, wherein the flat layer 14 covers the first illuminating pattern 131, the second illuminating pattern 132, and the driving array layer 12. The flat layer 14 may further include at least one connect hole, and a drain of the TFT is exposed by the connect hole.

The pixel electrode 15 is configured on intersections on the flat layer 14 between the first area Z1 and the second area Z2, and between the second area Z2 and the third area Z3, as such, the pixel electrode 15 configured on the intersections may be spaced apart from each other. The pixel electrode 15 covers the connect hole and connects with the drain of the TFT in each of the first area Z1, the second area Z2, and the third area Z3. In one example, the pixel electrode 15 may be a transparent conduction thin film made of indium tin oxide (ITO).

The pixel definition layer 16 is made of opaque material and is configured to configure an open area of the each of the sub-pixel areas within the active illuminating display panel 10, and each of the sub-pixel areas is surrounded by the pixel definition layer 16. That is, the pixel definition layer 16 is configured on intersections of the flat layer 14 between the first area Z1 and the second area Z2, and between the second area Z2 and the third area Z3. For example, as shown in FIG. 1, the pixel definition layer 16 may be configured on the intersections between the first area Z1 and the second area Z2, and between the second area Z2 and the third area Z3. The pixel definition layer 16 may further cover edges of the pixel electrode 15 between the first area Z1 and second area Z2, and between the second area Z2 and the third area Z3.

The third illuminating pattern 17 is configured on each of sub-pixel areas of the pixel electrode 15.

The reflection electrode 18 covers the third illuminating pattern 17 and the pixel definition layer 16. In one example, the reflection electrode 18 may be a whole surface structure made of, but not limited to, Ag or Al.

In one aspect, the third illuminating pattern 17 is configured between the pixel electrode 15 and the reflection electrode 18, and the third illuminating pattern 17 may be configured to be a light-emitting layer of the active illuminating display panel 10. In one example, the light-emitting layer may further include at least of a hole injection layer (HIL), a hole transporting layer (HTL), a hole blocking layer (HBL), an electron transport layer (ETL), an electron injection layer (EIL), and an electron blocking layer (HBL).

When voltage is conducted on the pixel electrode 15 and the reflection electrode 18, the third illuminating pattern 17 may emit the green light. The green light may directly be revealed from the green sub-pixel area in the second area Z2. In the first area Z1, the green is emitted to the first illuminating pattern 131, the quantum dots of the first illuminating pattern 131 may be excited to emit the red light. In the third area Z3, the greed light is emitted to the second illuminating pattern 132, the conversion illuminating material of the second illuminating pattern 132 may be excited to emit the blue light. As such, the active illuminating display panel 10 may achieve RGB (red-greed-blue) full-color display.

In one example, the first illuminating pattern 131 and the second illuminating pattern 132 are configured to be a photoluminescence color film (CF). Due to the photoluminescence quantum dots and the conversion illuminating material have attributes, such as adjustable luminous spectrum, high luminous efficiency and narrow full width at half maximum (FWHM). As such, the display color gamut may be enlarged, and light utilization rate may be improved.

The light-emitting layer of the active illuminating display panel 10 is configured to emit the green light instead of the blue light. The energy of the green light photons is lower than the energy of the blue light photons. As such, the high molecular organic material in the light-emitting layer may not decay easily and the lifecycle of the active illuminating display panel 10 may be extended.

Referring to FIG. 1, the active illuminating display panel 10 may further include an encapsulation layer 19. The encapsulation layer 19 covers the reflection electrode 18 and forms a sealed space with the substrate 11 corporately, so as to protect the components of the active illuminating display panel 10.

Figure 2:
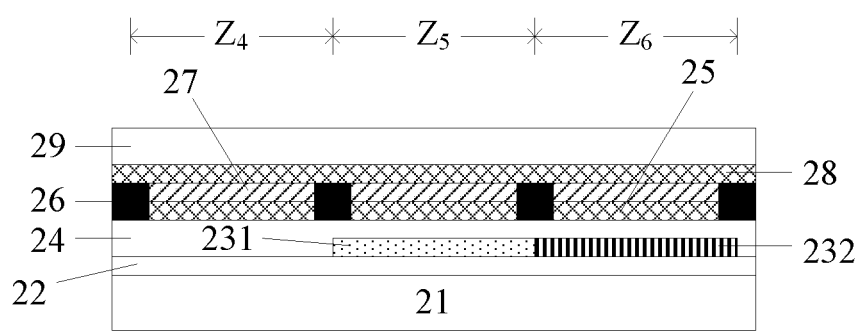
FIG. 2 is a schematic view of an active illuminating display panel in accordance with the second embodiment of the present disclosure.

Referring to FIG. 2, the active illuminating display panel 20 may include the substrate 21, the driving array layer 22, the first illuminating pattern 231, the second illuminating pattern 232, the flat layer 24, the pixel electrode 25, the pixel definition layer 26, the third illuminating pattern 27, the reflection electrode 28, and the encapsulation layer 29.

In one example, the substrate 21 may include, but not limited to, glass substrate and plastic substrate, and the substrate 21 may be made of PET, PEN, or PI.

The driving array layer 22 covers the substrate 21 and the driving array layer 22 may include the first area Z4, the second area Z5, and the third area Z6 configured along the direction parallel to the substrate 21 in sequence, and the first area Z4, the second area Z5, and the third area Z6 are adjacent along the direction. The first area Z4, the second area Z5, and the third area Z3 may be respectively configured to be the red sub-pixel area, the green sub-pixel area, and the blue sub-pixel area of the active illuminating display panel 20. In each of the first area Z4, the second area Z5, and the third area Z6, the electrical component for controlling the corresponding sub-pixel, such as the TFT, is configured in the driving array layer 22. The TFT may be the top-gate type TFT or the bottom-gate type TFT.

The first illuminating pattern 231 is configured on the second area Z5 of the driving array layer 22, and the first illuminating pattern 231 is made of conversion illuminating material. The conversion illuminating material may be excited by the red light and emit the green light, wherein the wavelength of the green light is less than the wavelength of the red light. The conversion illuminating material may be of the nanoparticle form, and each of the nanoparticles may include inorganic material and rare-earth ions doped in the inorganic material. The inorganic material may include, but not limited to, at least one of halides, oxides, sulfides, and sulfur oxides, and the rare-earth ions may include, but not limited to, at least one of $Er^{3+}$, $Ho^{3+}$, $Tm^{3+}$, $Pr^{3+}$, $Nd^{3+}$, and $Yb^{3+}$.

The second illuminating pattern 232 is configured on the third area Z6 of the driving array layer 22, and the second illuminating pattern 232 is made of conversion illuminating material. The conversion illuminating material may be excited by the red and emit the blue light, wherein the wavelength of the blue light is less than the wavelength of the red light. The conversion illuminating material may be of the nanoparticle form, and each of the nanoparticles may include inorganic material and rare-earth ions doped in the inorganic material. The inorganic material may include, but not limited to, at least one of halides, oxides, sulfides, and sulfur oxides, and the rare-earth ions may include, but not limited to, at least one of $Er^{3+}$, $Ho^{3+}$, $Tm^{3+}$, $Pr^{3+}$, $Nd^{3+}$, and $Yb^{3+}$.

The flat layer 24 is configured to be the translucent structure in a whole surface, wherein the flat layer 24 covers the first illuminating pattern 231, the second illuminating pattern 232, and the driving array layer 22. The flat layer 24 may further include at least one connect hole, and the drain of the TFT is exposed by the connect hole.

The pixel electrode 25 is configured on intersections on the flat layer 24 between the first area Z4 and the second area Z5, and between the second area Z5 and the third area Z6, as such, the pixel electrode 25 configured on the intersections may be spaced apart from each other. The pixel electrode 25 covers the connect hole and connects with the drain of the TFT in each of the first area Z4, the second area Z5, and the third area Z6. In one example, the pixel electrode 25 may be the transparent conduction thin film made of ITO.

The pixel definition layer 26 is made of the opaque material and is configured to configure the open area of the each of the sub-pixel areas within the active illuminating display panel 20, and each of the sub-pixel areas is surrounded by the pixel definition layer 26. That is, the pixel definition layer 26 is configured on intersection of the flat layer 24 between the first area Z4 and the second area Z5, and between the second area Z5 and the third area Z6. The pixel definition layer 26 may further cover the edges of the pixel electrode 25 between the first area Z4 and second area Z5, and between the second area Z5 and the third area Z6.

The third illuminating pattern 27 is configured on each of the sub-pixel areas of the pixel electrode 25.

The reflection electrode 28 covers the third illuminating pattern 27 and the pixel definition layer 26. In one example, the reflection electrode 28 may be a whole surface structure made of, but not limited to, Ag or Al.

The encapsulation layer 29 covers the reflection electrode 28 and forms the sealed space with the substrate 21 corporately, so as to protect the components of the active illuminating display panel 20.

In one aspect, the third illuminating pattern 27 is configured between the pixel electrode 25 and the reflection electrode 28, and the third illuminating pattern 27 may be configured to be the light-emitting layer of the active illuminating display panel 20. In one example, the light-emitting layer may further include at least one of the HIL, the HTL, the HBL, the ETL, the EIL, and the HBL.

When voltage is conducted on the pixel electrode 25 and the reflection electrode 28, the third illuminating pattern 27 may emit the red light. In the first area Z4, the red light may be directly revealed from the red sub-pixel area. In the second area Z5, the red is emitted to the first illuminating pattern 231, the conversion illuminating material of the first illuminating pattern 231 may be excited to emit the green light. In the third area Z6, the red light is emitted to the second illuminating pattern 232, the conversion illuminating material of the second illuminating pattern 232 may be excited to emit the blue light. As such, the active illuminating display panel 20 may achieve RGB full-color display.

In one example, the first illuminating pattern 231 and the second illuminating pattern 232 are configured to be the photoluminescence color film (CF). Due to the photoluminescence quantum dots and the conversion illuminating material have attributes, such as adjustable luminous spectrum, high luminous efficiency and narrow FWHM. As such, the display color gamut may be enlarged, and light utilization rate may be improved.

The light-emitting layer of the active illuminating display panel 20 is configured to emit the red light instead of the blue light. The energy of the red light photons is lower than the energy of the blue light photons. As such, the high molecular organic material in the light-emitting layer may not decay easily and the lifecycle of the active illuminating display panel 20 may be extended.

It is note that FIG. 1 and FIG. 2 are examples of the present disclosure. However, the present disclosure may further include other conventional structures in the prior art, which may not be described here.

Figure 3:
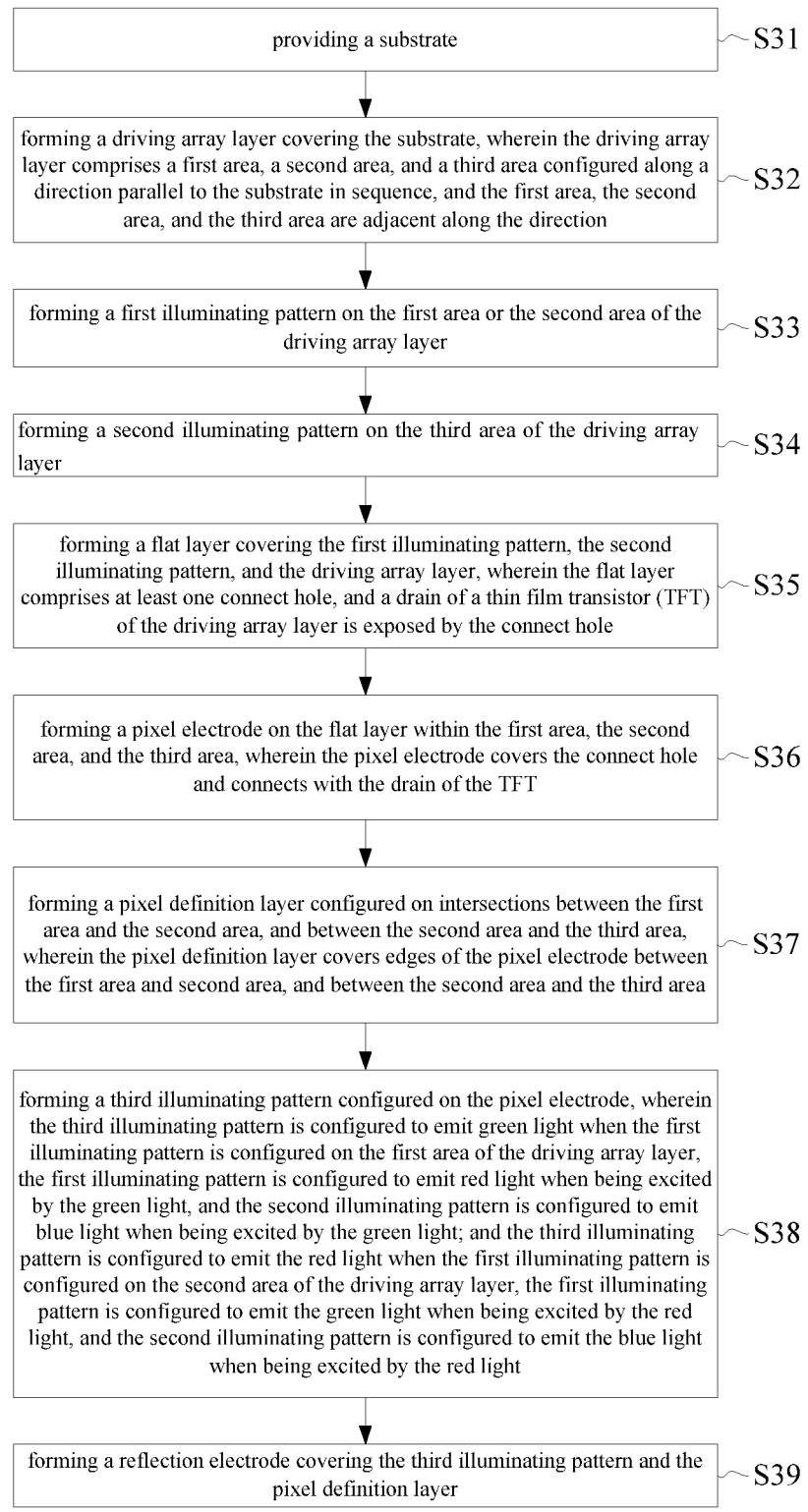
FIG. 3 is a flowchart of a manufacturing method of active illuminating display panel in accordance with one embodiment of the present disclosure.

Referring to FIG. 3, the present disclosure relates to a manufacturing method of active illustrating display panels. The active illustrating display panel shown in FIG. 1 and FIG. 2 may be manufactured by such manufacturing method. The following description is an example of the active illustrating display panel 10, as shown in FIG. 1, manufactured by the manufacturing method.

The manufacturing method may include the following steps.

In S31: providing the substrate.

In one example, the substrate 11 may include, but not limited to, glass substrate and plastic substrate, and the substrate 11 may be made of PET, PEN, or PI.

In S32: forming the driving array layer covering the substrate, wherein the driving array layer include the first area, the second area, and the third area configured along the direction parallel to the substrate in sequence, and the first area, the second area, and the third area are adjacent along the direction.

Figure 4:
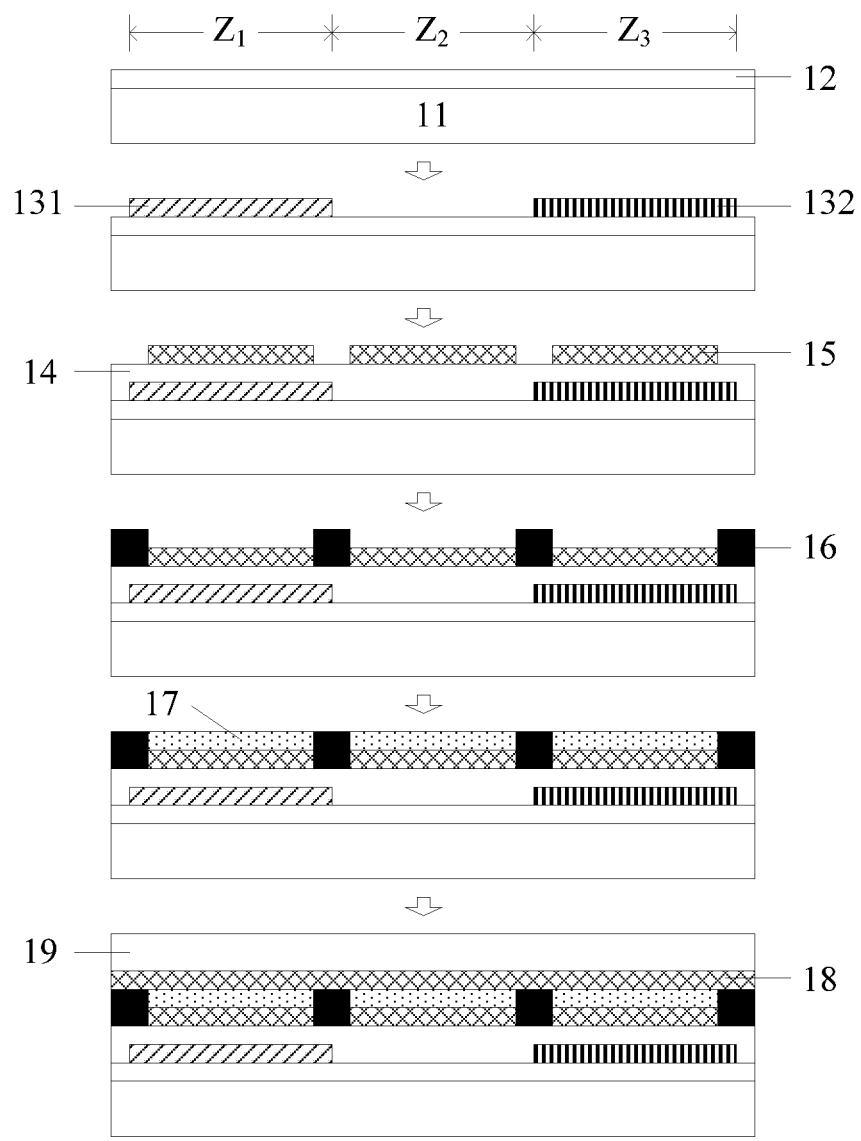
FIG. 4 is a schematic view of an active illuminating display panel, illustrated in FIG. 1, manufactured by the manufacturing method shown in FIG. 3.

Referring to FIG. 4, the driving array layer 12 may include the first area Z1, the second area Z2, and the third area Z3 configured along the direction parallel to the substrate 11 in sequence, and the first area Z1, the second area Z2, and the third area Z3 are adjacent along the direction. The first area Z1, the second area Z2, and the third area Z3 may be respectively configured to be the red sub-pixel area, the green sub-pixel area, and the blue sub-pixel area of the active illuminating display panel 10. In each of the first area Z1, the second area Z2, and the third area Z3, the electrical component for controlling the corresponding sub-pixel, such as the TFT, is configured in the driving array layer 12. The TFT may be the top-gate type TFT or the bottom-gate type TFT.

The bottom-gate type TFT is considered to be as an example, and the manufacturing method of the TFT is described as below.

A physical vapor deposition (PVD) process may be conducted to form the metal layer in a whole surface on the substrate 11. A patterned process may be conducted on the metal layer to preserve the metal layer within a predetermined area, so as to form the gate. Wherein, the patterned process may include a coating photoresist process, an exposure process, a development process, and an etching process.

A chemical vapor deposition (CVD) process may be conducted to form an insulation layer in a whole surface, wherein the insulation layer covers the gate. The insulation layer may be made of SiOx, or the insulation layer may include a silicon oxide layer and a silicon nitride compound layer in sequence, wherein the silicon oxide layer covers the gate. For example, the silicon oxide layer and a silicon nitride compound layer may be a SiO2 layer and a Si3N4 layer. As such, wear resistance and insulation performance of the insulation layer may further be improved.

The same patterned process may be conducted to form the source and the drain of the TFT.

In S33: forming the first illuminating pattern on the first area or the second area of the driving array layer.

Referring to FIG. 4, the first illuminating pattern 131 is formed on the first area Z1 of the driving array layer 12 by conducting the PVD process, a sputtering process, and an evaporation process.

In S34: forming the second illuminating pattern on the third area of the driving array layer.

The second illuminating pattern 132 is formed on the third area Z3 of the driving array layer 12 by conducting the PVD process, the sputtering process, and the evaporation process.

In S35: forming the flat layer covering the first illuminating pattern, the second illuminating pattern, and the driving array layer, wherein the flat layer includes at least one connect hole, and the drain of the TFT of the driving array layer is exposed by the connect hole.

The flat layer 14 is the translucent structure in a whole surface, which covers the first illuminating pattern 131, the second illuminating pattern 132, and the driving array layer 12. The flat layer 14 may be formed by conducting the CVD process. Further, the etching process may be conducted, such that the contact hole may be formed on the drain of the TFT on the flat layer 14, and the drain is exposed by the contact hole.

In S36: forming the pixel electrode on the flat layer within the first area, the second area, and the third area, wherein the pixel electrode covers the connect hole and connects with the drain of the TFT.

The pixel electrode 15 may be formed by conducting the PVD process and the patterned process. A transparent electrode in a whole surface may be formed on the flat layer 14 by conducting the PVD process. The patterned process may be conducted, such as the etching process, to remove the transparent electrode configured on the intersections between the first area Z1 and the second area Z2, and between the second area Z2 and the third area Z3. Such that, at least one open area may be formed on the transparent electrode, wherein the open area is configured on the intersections between the first area Z1 and the second area Z2, and between the second area Z2 and the third area Z3. That is, the pixel electrode 15 configured on the first area Z1 and the second area Z2 may be spaced apart from each other, and the the pixel electrode 15 configured on the second area Z2 and the third area Z3 may be spaced apart from each other.

In one example, a mask having at least one hollow area and at least one non-hollow area may be configured on the flat layer 14. The transparent conductive material may be deposited on the flat layer 14 via the hollow area of the mask. The transparent conductive material may be blocked by the non-hollow area of the mask, and may not be deposited on the flat layer 14. As such, the pixel electrode 15 may be formed.

In S37: forming the pixel definition layer configured on intersections between the first area and the second area, and between the second area and the third area, wherein the pixel definition layer covers edges of the pixel electrode between the first area and second area, and between the second area and the third area.

In S38: forming the third illuminating pattern configured on the pixel electrode, wherein the third illuminating pattern is configured to emit green light when the first illuminating pattern is configured on the first area of the driving array layer, the first illuminating pattern is configured to emit red light when being excited by the green light, and the second illuminating pattern is configured to emit blue light when being excited by the green light; and the third illuminating pattern is configured to emit the red light when the first illuminating pattern is configured on the second area of the driving array layer, the first illuminating pattern is configured to emit the green light when being excited by the red light, and the second illuminating pattern is configured to emit the blue light when being excited by the red light.

Referring to FIG. 4, the third illuminating pattern 17 is formed on the pixel electrode 15 on each of the sub-pixels by conducting the PVD process, the sputtering process, and the evaporation process.

In S39: forming the reflection electrode covering the third illuminating pattern and the pixel definition layer.

The reflection electrode 18 is a whole structure covering the third illuminating pattern 17 and the definition layer 16. The sputtering process may be conducted to form a conductive metal layer covering the third illuminating pattern 17 and the definition layer 16, so as to form the reflection electrode 18. The conductive metal layer is made of, but not limited to, Ag or Al.

The encapsulation layer 19 may be formed on the reflection electrode 18 by conducting the PVD process, the sputtering process, and the evaporation process. The encapsulation layer 19 covers the reflection electrode 18 and forms the sealed space with the substrate 11 corporately, so as to protect the components of the active illuminating display panel 10.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. An active illuminating display panel, comprising:
    a substrate;
    a driving array layer covering the substrate, wherein the driving array layer comprises a first area, a second area, and a third area configured along a direction parallel to the substrate in sequence, and the first area, the second area, and the third area are adjacent along the direction;
    a first illuminating pattern configured on the first area of the driving array layer, wherein the first illuminating pattern is made of a plurality of photoluminescence quantum dots;
    a second illuminating pattern configured on the third area of the driving array layer, wherein the second illuminating pattern is made of conversion illuminating material of a nanoparticle form, and each nanoparticle of the nanoparticle form comprises inorganic material and rare-earth ions doped in the inorganic material;
    a flat layer covering the first illuminating pattern, the second illuminating pattern, and the driving array layer, wherein the flat layer comprises at least one connect hole, and a drain of a thin film transistor (TFT) of the driving array layer is exposed by the connect hole;
    a pixel electrode configured on the flat layer within the first area, the second area, and the third area, wherein the pixel electrode covers the connect hole and connects with the drain of the TFT;
    a pixel definition layer configured on intersections between the first area and the second area, and between the second area and the third area, wherein the pixel definition layer is made of opaque material and covers edges of the pixel electrode between the first area and second area, and between the second area and the third area;
    a third illuminating pattern configured on the pixel electrode;
    a reflection electrode covering the third illuminating pattern and the pixel definition layer;
    wherein the third illuminating pattern is configured to emit green light, the first illuminating pattern is configured to emit red light when being excited by the green light, and the second illuminating pattern is configured to emit blue light when being excited by the green light.

2. The active illuminating display panel according to claim 1, wherein the inorganic material comprises at least one of halides, oxides, sulfides, and sulfur oxides, and the rare-earth ions comprises at least one of $Er^{3+}$, $Ho^{3+}$, $Tm^{3+}$, $Pr^{3+}$, $Nd^{3+}$, and $Yb^{3+}$.

3. An active illuminating display panel, comprising:
    a substrate;
    a driving array layer covering the substrate, wherein the driving array layer comprises a first area, a second area, and a third area configured along a direction parallel to the substrate in sequence, and the first area, the second area, and the third area are adjacent along the direction;
    a first illuminating pattern configured on the first area of the driving array layer;
    a second illuminating pattern configured on the third area of the driving array layer;
    a flat layer covering the first illuminating pattern, the second illuminating pattern, and the driving array layer, wherein the flat layer comprises at least one connect hole, and a drain of a thin film transistor (TFT) of the driving array layer is exposed by the connect hole;
    a pixel electrode configured on the flat layer within the first area, the second area, and the third area, wherein the pixel electrode covers the connect hole and connects with the drain of the TFT;
    a pixel definition layer configured on intersections between the first area and the second area, and between the second area and the third area, wherein the pixel definition layer covers edges of the pixel electrode between the first area and second area, and between the second area and the third area;
    a third illuminating pattern configured on the pixel electrode;
    a reflection electrode covering the third illuminating pattern and the pixel definition layer;

wherein the third illuminating pattern is configured to emit green light when the first illuminating pattern is configured on the first area of the driving array layer, the first illuminating pattern is configured to emit red light when being excited by the green light, and the second illuminating pattern is configured to emit blue light when being excited by the green light; and the third illuminating pattern is configured to emit the red light when the first illuminating pattern is configured on the second area of the driving array layer, the first illuminating pattern is configured to emit the green light when being excited by the red light, and the second illuminating pattern is configured to emit the blue light when being excited by the red light.

4. The active illuminating display panel according to claim 3, wherein the first illuminating pattern is configured on the first area of the driving array layer, the first illuminating pattern is made of a plurality of photoluminescence quantum dots, and the second illuminating pattern is made of conversion illuminating material.

5. The active illuminating display panel according to claim 4, wherein the conversion illuminating material comprises inorganic material and rare-earth ions doped in the inorganic material.

6. The active illuminating display panel according to claim 5, wherein the conversion illuminating material is of a nanoparticle form.

7. The active illuminating display panel according to claim 3, wherein the first illuminating pattern is configured on the first area of the driving array layer, and the first illuminating pattern and the second illuminating pattern are made of conversion illuminating material.

8. The active illuminating display panel according to claim 7, wherein the conversion illuminating material comprises inorganic material and rare-earth ions doped in the inorganic material.

9. The active illuminating display panel according to claim 8, wherein the conversion illuminating material is of a nanoparticle form.

10. The active illuminating display panel according to claim 3, wherein the inorganic material comprises at least one of halides, oxides, sulfides, and sulfur oxides, and the rare-earth ions comprises at least one of $Er^{3+}$, $Ho^{3+}$, $Tm^{3+}$, $Pr^{3+}$, $Nd^{3+}$, and $Yb^{3+}$.

11. The active illuminating display panel according to claim 3, wherein the pixel definition layer is made of opaque material.

12. A manufacturing method of display panels, comprising:
providing a substrate;
forming a driving array layer covering the substrate, wherein the driving array layer comprises a first area, a second area, and a third area configured along a direction parallel to the substrate in sequence, and the first area, the second area, and the third area are adjacent along the direction;
forming a first illuminating pattern on the first area or the second area of the driving array layer;
forming a second illuminating pattern on the third area of the driving array layer;
forming a flat layer covering the first illuminating pattern, the second illuminating pattern, and the driving array layer, wherein the flat layer comprises at least one connect hole, and a drain of a thin film transistor (TFT) of the driving array layer is exposed by the connect hole;
forming a pixel electrode on the flat layer within the first area, the second area, and the third area, wherein the pixel electrode covers the connect hole and connects with the drain of the TFT;
forming a pixel definition layer configured on intersections between the first area and the second area, and between the second area and the third area, wherein the pixel definition layer covers edges of the pixel electrode between the first area and second area, and between the second area and the third area;
forming a third illuminating pattern configured on the pixel electrode, wherein the third illuminating pattern is configured to emit green light when the first illuminating pattern is configured on the first area of the driving array layer, the first illuminating pattern is configured to emit red light when being excited by the green light, and the second illuminating pattern is configured to emit blue light when being excited by the green light; and the third illuminating pattern is configured to emit the red light when the first illuminating pattern is configured on the second area of the driving array layer, the first illuminating pattern is configured to emit the green light when being excited by the red light, and the second illuminating pattern is configured to emit the blue light when being excited by the red light;
forming a reflection electrode covering the third illuminating pattern and the pixel definition layer.

13. The manufacturing method according to claim 12, wherein the first illuminating pattern is configured on the first area of the driving array layer, the first illuminating pattern is made of a plurality of photoluminescence quantum dots, and the second illuminating pattern is made of conversion illuminating material.

14. The manufacturing method according to claim 13, wherein the conversion illuminating material comprises inorganic material and rare-earth ions doped in the inorganic material.

15. The manufacturing method according to claim 14, wherein the conversion illuminating material is of a nanoparticle form.

16. The manufacturing method according to claim 12, wherein the first illuminating pattern is configured on the first area of the driving array layer, and the first illuminating pattern and the second illuminating pattern are made of conversion illuminating material.

17. The manufacturing method according to claim 16, wherein the conversion illuminating material comprises inorganic material and rare-earth ions doped in the inorganic material.

18. The manufacturing method according to claim 12, wherein the conversion illuminating material is of a nanoparticle form.

19. The manufacturing method according to claim 12, wherein the inorganic material comprises at least one of halides, oxides, sulfides, and sulfur oxides, and the rare-earth ions comprises at least one of $Er^{3+}$, $Ho^{3+}$, $Tm^{3+}$, $Pr^{3+}$, $Nd^{3+}$, and $Yb^{3+}$.

20. The manufacturing method according to claim 12, wherein the pixel definition layer is made of opaque material.

* * * * *